United States Patent
Yagi et al.

(10) Patent No.: US 7,646,101 B2
(45) Date of Patent: Jan. 12, 2010

(54) SEMICONDUCTOR DEVICE AND MANUFACTURING METHOD THEREOF

(75) Inventors: Ryotaro Yagi, Kyoto (JP); Shinichi Chikaki, Tokyo (JP); Yoshinori Shishida, Gifu (JP)

(73) Assignees: Rohm Co., Ltd., Kyoto (JP); NEC Corporation, Tokyo (JP); Sanyo Electric Co., Ltd., Osaka (JP)

( * ) Notice: Subject to any disclaimer, the term of this patent is extended or adjusted under 35 U.S.C. 154(b) by 229 days.

(21) Appl. No.: 11/729,765

(22) Filed: Mar. 28, 2007

(65) Prior Publication Data

US 2007/0228528 A1    Oct. 4, 2007

(30) Foreign Application Priority Data

Mar. 29, 2006    (JP) .............................. 2006-091666

(51) Int. Cl.
*H01L 29/40* (2006.01)
(52) U.S. Cl. ................ 257/775; 257/635; 257/E21.579
(58) Field of Classification Search ................ 257/775, 257/635, E21.579
See application file for complete search history.

(56) References Cited

U.S. PATENT DOCUMENTS 7,250,370 B2 *    7/2007    Chang et al. ................ 438/694

FOREIGN PATENT DOCUMENTS

| JP | 2000-012532 | 1/2000 |
|---|---|---|
| JP | 2004-047873 | 2/2004 |
| JP | 2004-158704 | 6/2004 |
| JP | 2004-221498 | 8/2004 |
| JP | 2004-292304 | 10/2004 |
| JP | 2005-272188 | 10/2005 |
| JP | 2006-041039 | 2/2006 |

\* cited by examiner

*Primary Examiner*—Jack Chen
(74) *Attorney, Agent, or Firm*—Fish & Richardson P.C.

(57) ABSTRACT

An insulating layer is formed on a semiconductor substrate, and has a through hole for via. A porous silica layer has a trench for interconnection communicating to the through hole for via, and is formed on the insulating layer in contact therewith. A conductive layer is formed in the through hole for via and in the trench for interconnection. The insulating layer is formed from a material containing carbon, hydrogen, oxygen, and silicon, and having absorption peak attributed to Si—$CH_3$ bond in a range from at least 1260 $cm^{-1}$ to at most 1280 $cm^{-1}$ (around 1274 $cm^{-1}$) when measured with FT-IR. Thus, a semiconductor device having a porous insulating layer in which depth of the trench for interconnection is readily controlled, a dielectric constant is low, and increase in leakage current is less likely, as well as a manufacturing method thereof can be obtained.

3 Claims, 9 Drawing Sheets

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and more particularly to a semiconductor device having a porous insulating layer and a manufacturing method thereof 2. Description of the Background Art In recent years, in order to achieve high performance of a semiconductor device, a technique to lower interconnection resistance and capacitance between interconnections has been developed. Forming of a copper interconnection has been known as one technique to lower interconnection resistance. Here, as the copper interconnection is formed in an interlayer insulating film, an interlayer insulating film having low dielectric constant should be employed, in order to lower interconnection capacitance. Various techniques employing a porous material for the interlayer insulating film of low dielectric constant have been proposed (see, for example, Japanese Patent Laying-Open Nos. 2004-221498, 2004-158704, and 2006-041039).

Meanwhile, porous silica has been known as a porous material having low dielectric constant, high mechanical strength and high insulation (see, for example, Japanese Patent Laying-Open Nos. 2004-292304 and 2005-272188). The porous silica can be obtained by preparing and applying a coating liquid followed by drying and annealing.

If porous silica above is used for the interlayer insulating film of the semiconductor device, however, the following problems arise.

In forming, with etching, a via and a trench for interconnection communicating to the via in the interlayer insulating film formed as a single layer of porous silica, control of depth of the trench for interconnection during etching is difficult. In addition, when etching should be suspended, etching causes damage of porous silica at the bottom of the trench for interconnection, which leads to increase in a leakage current and higher dielectric constant in that portion.

In order to facilitate control of depth of the trench for interconnection, it is also possible to employ a stack structure of another insulating layer and porous silica as the interlayer insulating film, and to form a via and a trench for interconnection in another insulating layer and porous silica, respectively. In such a case, however, annealing for forming porous silica causes increase in the leakage current and higher dielectric constant in another insulating layer.

SUMMARY OF THE INVENTION

The present invention was made in view of the above-described problems. An object of the present invention is to provide a semiconductor device having a porous insulating layer in which depth of a trench for interconnection is readily controlled, a dielectric constant is low, and increase in leakage current is less likely, and a manufacturing method thereof.

A semiconductor device according to the present invention includes a semiconductor substrate, an insulating layer, and a porous silica layer. The insulating layer is formed on the semiconductor substrate and has a through hole for connection. The porous silica layer has a trench for interconnection communicating to the through hole for connection and is formed on the insulating layer in contact with the insulating layer. The insulating layer is formed from a material containing carbon, hydrogen, oxygen, and silicon, and having absorption peak in a range from at least 1260 $cm^{-1}$ to at most 1280 $cm^{-1}$ when measured with Fourier transform infrared absorption spectroscopy.

According to the semiconductor device of the present invention, the insulating layer is provided under the porous silica layer. Accordingly, in forming the trench for interconnection in the porous silica layer with etching, the insulating layer serves as etching stopper. Therefore, control in a direction of depth of the trench for interconnection is facilitated.

In addition, as the insulating layer is not porous, damage thereof caused by etching for forming the trench for interconnection is less likely. Therefore, increase in the leakage current or increase in the dielectric constant due to such damage can be suppressed.

Moreover, the insulating layer is formed from a material having absorption peak in a range from at least 1260 $cm^{-1}$ to at most 1280 $cm^{-1}$ when measured with Fourier transform infrared absorption spectroscopy. Accordingly, even if annealing for forming porous silica is performed, increase in the leakage current and also increase in the dielectric constant in the insulating layer can be suppressed.

In the semiconductor device described above, preferably, absorption peak of the insulating layer is attributed to Si—$CH_3$ bond.

In the semiconductor device described above, preferably, the porous silica layer has an average pore diameter in a range from at least 1 nm to at most 10 nm.

In the semiconductor device described above, preferably, the insulating layer contains carbon in an amount ranging from at least 10 atomic % to at most 40 atomic %.

A method of manufacturing a semiconductor device according to the present invention includes the steps of: depositing an insulating layer containing carbon, hydrogen, oxygen, and silicon on a semiconductor substrate by producing plasma of dimethyldimethoxysilane used as a raw material; and forming a porous silica layer by applying a coating liquid on a surface of the insulating layer followed by drying and annealing.

According to the method of manufacturing the semiconductor device of the present invention, plasma of dimethyldimethoxysilane used as a raw material is produced, so that the insulating layer containing carbon, hydrogen, oxygen, and silicon is formed on the semiconductor substrate. Accordingly, the insulating layer has absorption peak attributed to Si—$CH_3$ bond in a range from at least 1260 $cm^{-1}$ to at most 1280 $cm^{-1}$ when measured with Fourier transform infrared absorption spectroscopy. Therefore, even if annealing for forming porous silica is performed, increase in the leakage current and also increase in the dielectric constant in the insulating layer can be suppressed.

According to the method of manufacturing a semiconductor device described above, preferably, annealing is performed in an atmosphere containing oxygen.

As described above, according to the semiconductor device and the manufacturing method thereof of the present invention, a semiconductor device having a porous insulating layer in which depth of a trench for interconnection is readily controlled, a dielectric constant is low, and increase in leakage current is less likely can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will be described hereinafter with reference to the drawings.

Figure 1:
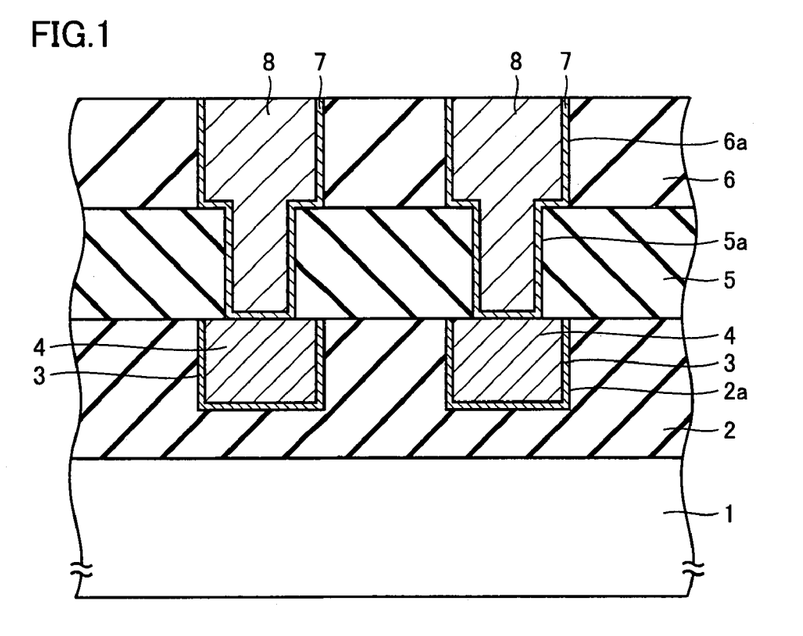
FIG. 1 is a cross-sectional view schematically showing a structure of a semiconductor device according to one embodiment of the present invention.

Referring to FIG. 1, an insulating layer 2 is formed on the surface of a semiconductor substrate 1. A trench 2a for interconnection is formed in the upper surface of insulating layer 2. A barrier metal layer 3 is formed along the sidewall of trench 2a for interconnection, and a conductive layer 4 is formed to bury trench 2a for interconnection.

On insulating layer 2, an insulating layer 5 and a porous silica layer 6 are stacked and formed as an interlayer insulating layer. Insulating layer 5 is formed on insulating layer 2. In insulating layer 5, a via (through hole for connection) 5a that penetrates insulating layer 5 and reaches the surface of conductive layer 4 is formed. Porous silica layer 6 is formed on insulating layer 5 in contact therewith. In porous silica layer 6, a trench 6a for interconnection that penetrates porous silica layer 6 and communicates to via 5a is formed. A barrier metal layer 7 is formed along the sidewall of via 5a and trench 6a for interconnection, and a conductive layer 8 composed, for example, of copper is formed to bury via 5a arid trench 6a for interconnection. The portion of conductive layer 8 filling trench 6a for interconnection serves as an interconnection portion, and the portion thereof filling via 5a serves as a via plug portion.

Insulating layer 5 is formed from a material containing carbon, hydrogen, oxygen, and silicon, and having absorption peak attributed to Si—CH$_3$ bond in a range from at least 1260 $cm^{-1}$ to at most 1280 $cm^{-1}$ (around 1274 $cm^{-1}$) when measured with Fourier transform infrared absorption spectroscopy (FT-IR). FT-IR absorption spectrum, can be measured by setting a sample in a commercially available apparatus: FTS3000 (manufactured by DIGILAB). Insulating layer 5 preferably contains carbon in an amount ranging from at least 10 atomic % to at most 40 atomic %. In addition, insulating layer 5 is formed as a film having low dielectric constant, i.e., having k (relative dielectric constant)=approximately 2.8 to 3.3.

Moreover, preferably, porous silica layer 6 has an average pore diameter in a range from at least 1 nm to at most 10 nm. If the average pore diameter is set to a value in this range, sufficient mechanical strength and lower dielectric constant can both be achieved. Porous silica layer 6 has, for example, a relative dielectric constant of 2.1, and has a Young's modulus of 8 GPa. A hole formed in porous silica layer 6 is open-porous (open pore) communicating to the outside. Here, the average pore diameter can generally be measured with an X-ray small angle scattering measurement apparatus such as ATX manufactured by Rigaku Corporation. Preferably, porous silica layer 6 has a mesopore.

A method of manufacturing the semiconductor device according to the present embodiment will now be described.

Figure 2:
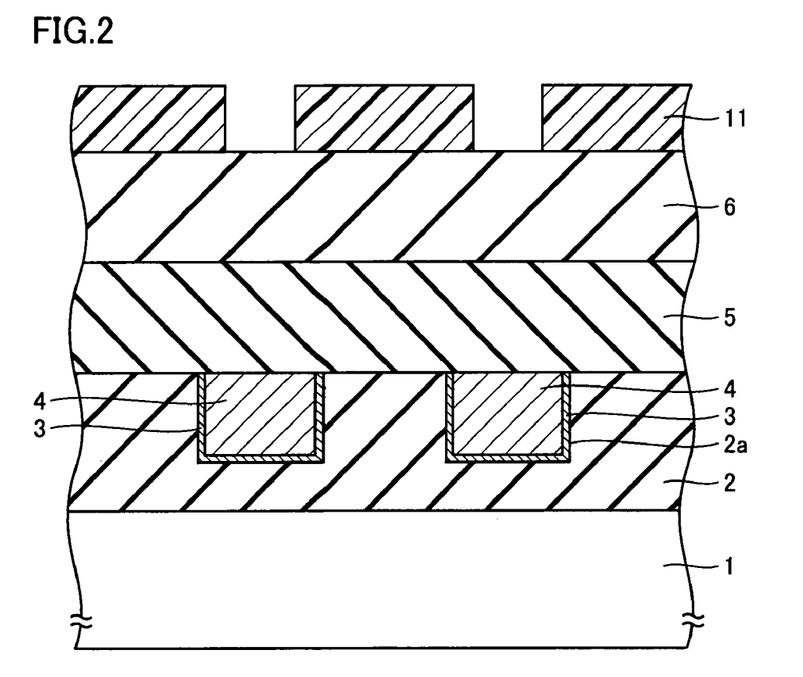
FIGS. 2 to 5 are schematic cross-sectional views successively showing the steps in a method of manufacturing the semiconductor device according to one embodiment of the present invention.

Referring to FIG. 2, insulating layer 2 is formed on semiconductor substrate 1. Trench 2a for interconnection is formed in the surface of insulating layer 2 using photomechanical process and etching. Barrier metal layer 3 is formed along the sidewall of trench 2a for interconnection, and thereafter, conductive layer 4 fills trench 2a for interconnection.

Insulating layer 5 is formed on insulating layer 2. Insulating layer 5 is composed of SiOCH containing carbon, hydrogen, oxygen, and silicon, and formed, for example, by feeding DMDMOS (dimethyldimethoxysilane) into a parallel-plate-type chamber using He (helium) gas as a carrier gas, applying an AC voltage of 27.12 MHz to parallel plates so as to produce plasma of DMDMOS, and depositing DMDMOS on a silicon wafer placed in the chamber.

A coating liquid composed of an organic component and a silica oligomer is applied onto insulating layer 5 using spin coating, followed by drying, and annealing is carried out stepwise at temperatures from 300 to 400° C. in an oxygen-added nitrogen atmosphere, thus forming porous silica layer 6. The atmosphere for annealing is not limited to the oxygen-added nitrogen atmosphere, and any atmosphere containing oxygen may be employed.

A photoresist 11 is applied onto porous silica layer 6, and patterned by using photomechanical process. Using resist pattern 11 as a mask, porous silica layer 6 and insulating layer 5 are successively etched.

Figure 3:
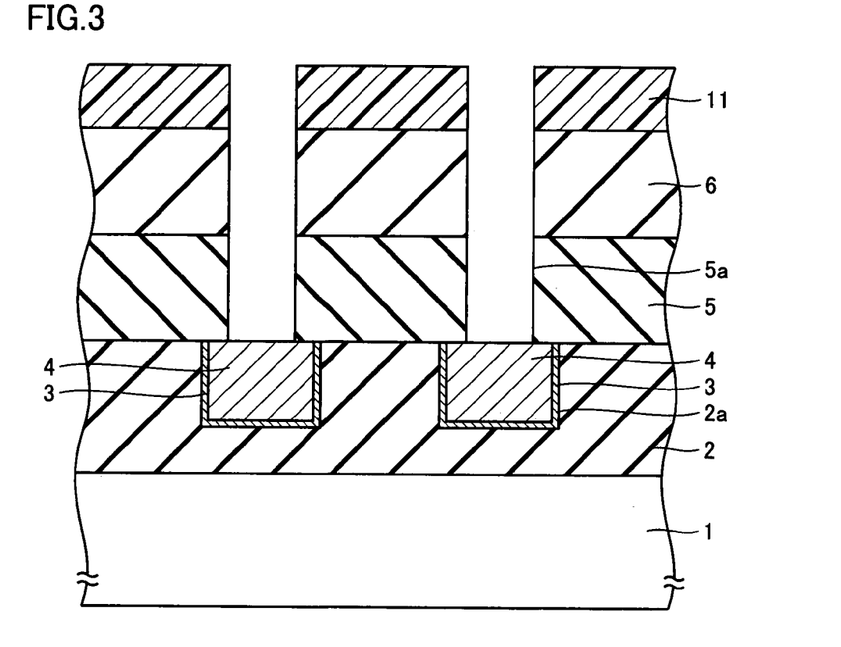

Referring to FIG. 3, as a result of etching, a through hole that penetrates porous silica layer 6 and insulating layer 5 is formed, thus forming via 5a serving as the through hole in insulating layer 5. Thereafter, resist pattern 11 is removed, for example, by ashing or the like.

Figure 4:
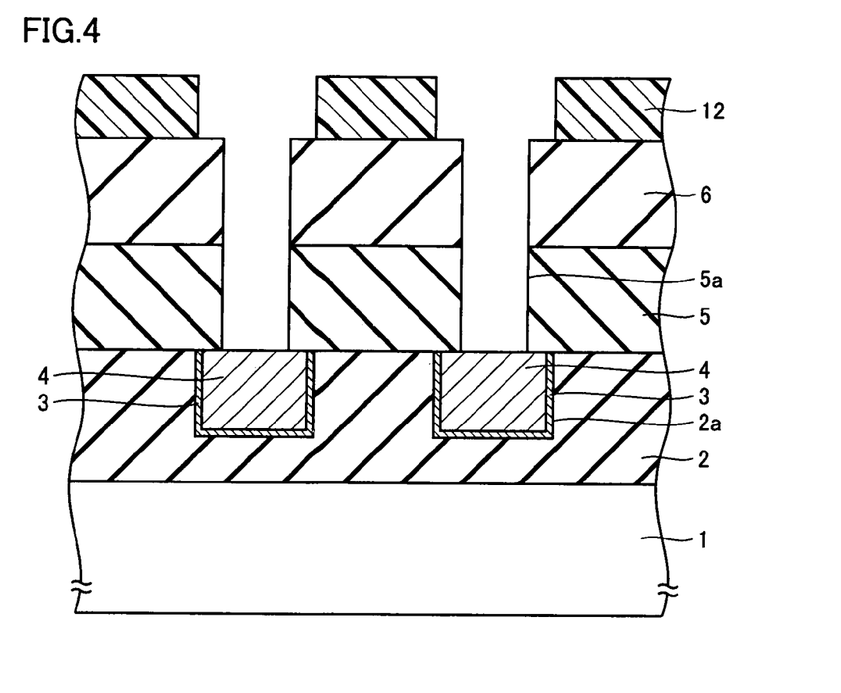

Referring to FIG. 4, a photoresist 12 is applied onto porous silica layer 6, and patterned by using photomechanical process. Using resist pattern 12 as a mask, porous silica layer 6 is etched.

Figure 5:
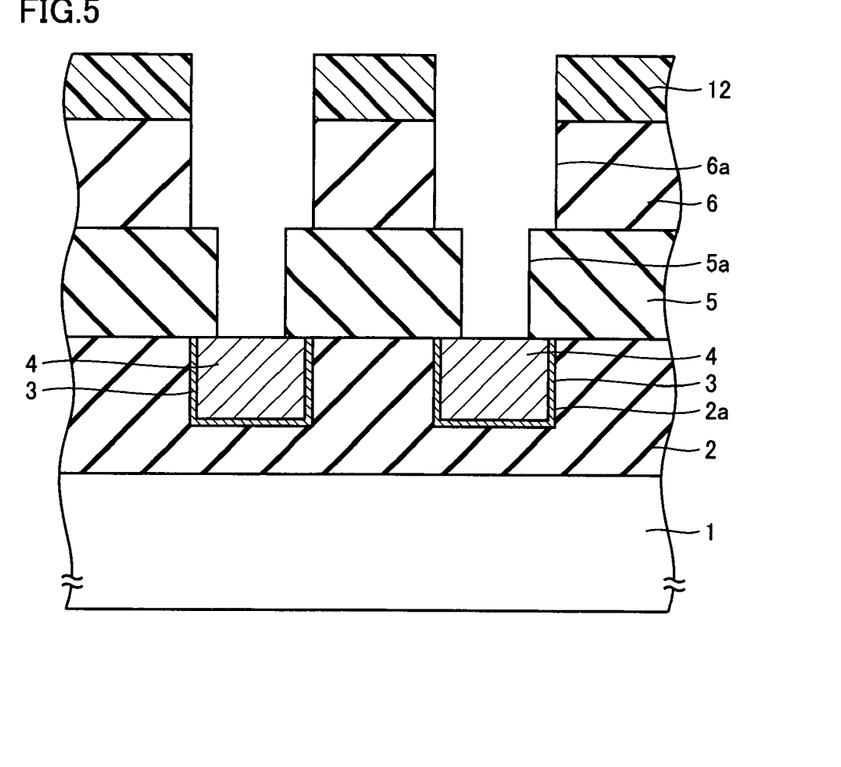

Referring to FIG. 5, as a result of etching, trench 6a for interconnection that penetrates porous silica layer 6 and reaches insulating layer 5 is formed. During etching for forming trench 6a for interconnection, insulating layer 5 serves as etching stopper. Thus, control of depth of trench 6a for interconnection is facilitated. Thereafter, resist pattern 12 is removed, for example, by ashing or the like.

Referring to FIG. 1, a barrier metal 7 is formed along the wall surface of via 5a and trench 6a for interconnection. Thereafter, conductive layer 8 composed, for example, of copper is formed to bury via 5a and trench 6a for interconnection. Thus, the semiconductor device according to the present embodiment is manufactured.

It is confirmed through observation of the silica layer using transmission electron microscope that the resultant pore structure in porous silica layer 6 is realized as pores in random shapes. Alternatively, the pore structure in porous silica layer 6 can also be confirmed by using X-ray diffraction (CuKα).

In addition, it is confirmed that the average pore diameter in porous silica layer 6 is in a range from 1 nm to 10 nm, by using the X-ray small angle scattering measurement apparatus described above or the like.

A function and effect of the present embodiment will now be described.

According to the semiconductor device of the present embodiment, insulating layer 5 is provided under porous silica layer 6. Therefore, as shown in FIG. 5, in forming trench 6a for interconnection in porous silica layer 6 using etching, insulating layer 5 serves as etching stopper. Thus, control in a direction of depth of trench 6a for interconnection is facilitated.

In addition, as insulating layer 5 is not porous, damage thereof caused by etching for forming trench 6a for interconnection in the step shown in FIG. 5 is less likely. Therefore, generation of leakage current or increase in the dielectric constant due to such damage can be suppressed.

Moreover, insulating layer 5 is formed from a material having absorption peak attributed to Si—$CH_3$ bond in a range from at least 1260 $cm^{-1}$ to at most 1280 $cm^{-1}$ (around 1274 $cm^{-1}$) when measured with FT-IR. Therefore, as will be described later, even if annealing for forming porous silica is performed, increase in the leakage current and also increase in the dielectric constant in insulating layer 5 can be suppressed.

In addition, insulating layer 5 containing carbon, hydrogen, oxygen, and silicon is formed by producing plasma of dimethyldimethoxysilane used as a raw material. Thus, insulating layer 5 having absorption peak attributed to Si—$CH_3$ bond in a range from at least 1260 $cm^{-1}$ to at most 1280 $cm^{-1}$ (around 1274 $cm^{-1}$) when measured with FT-IR can be formed. Therefore, even if annealing for forming porous silica is performed, increase in the leakage current and also increase in the dielectric constant in the insulating layer can be suppressed.

Figure 6:
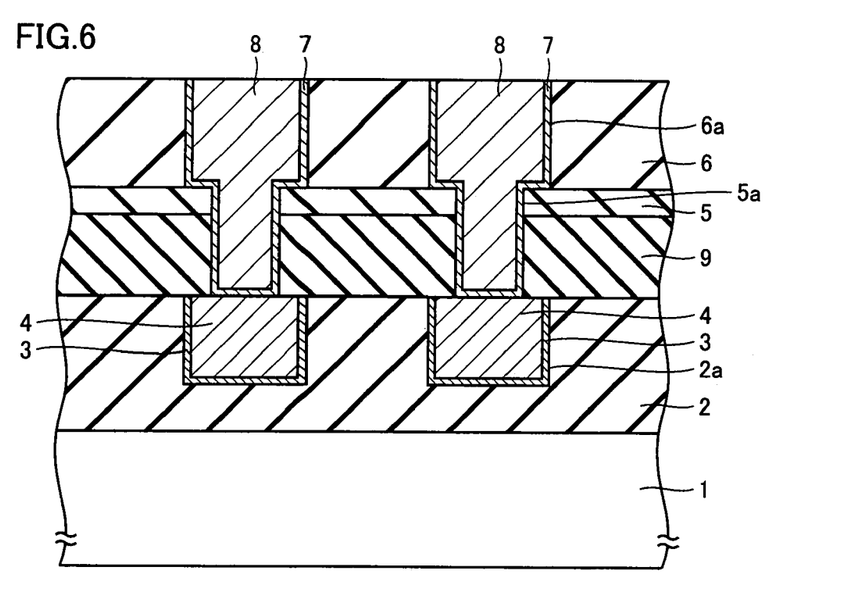
FIG. 6 is a cross-sectional view schematically showing another structure of a semiconductor device according to one embodiment of the present invention.

In the embodiment shown in FIG. 1, a case where via 5a is formed only through single insulating layer 5 is described, however, another insulating layer 9 may be provided under insulating layer 5 and via 5a may be formed through insulating layers 5 and 9, as shown in FIG. 6. Alternatively, the insulating layer where via 5a is formed may be formed as a stack structure of three or more layers.

EXAMPLE

An example of the present invention will be described hereinafter with reference to the drawings.

The present inventors have conducted a close study, in order to obtain an insulating layer in which increase in leakage current is less likely and dielectric constant can be maintained low even if annealing for forming the porous silica layer is performed, and finally completed the present invention. The details of the study and the result will be described below.

Figure 7:
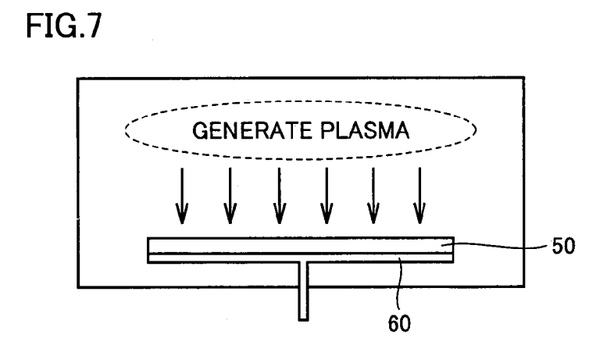
FIG. 7 is a schematic cross-sectional view showing a manner of depositing three types of insulating layers on a wafer with CVD.

Samples, in which three types of insulating layers according to Comparative Example 1, Comparative Example 2 and Example of the Present Invention were formed on 300 mm wafers using CVD (Chemical Vapor Deposition) respectively, were prepared. The insulating layer according to Comparative Example 1 had the composition of Si/C/O/H=6.3/24.4/7.3/62.0 atomic %. In addition, the insulating layer according to Comparative Example 2 had the composition of Si/C/O/H=2.9/34.0/2.0/61.0 atomic %. Moreover, the insulating layer according to Example of the Present Invention had the composition of Si/C/O/H=14.7/16.2/21.1/48.0 atomic % In particular, as shown in FIG. 7, the insulating layer according to Example of the Present Invention was formed by setting a temperature of a stage 60 to 350° C., feeding DMDMOS into a parallel-plate-type chamber using He gas as a carrier gas, applying an AC voltage of 27.12 MHz to parallel plates so as to produce plasma of DMDMOS, and depositing DMDMOS on a wafer 50 placed in the chamber. Meanwhile, for the insulating layer according to Comparative Example 1, a cyclic siloxane copolymer film formed with a film forming method described in Japanese Patent Laying-Open No. 2004-047873 was used, and for the insulating layer according to Comparative Example 2, an organic siloxane copolymer film formed with a film forming method described in Japanese Patent Laying-Open No. 2000-012532 was used.

Figure 8:
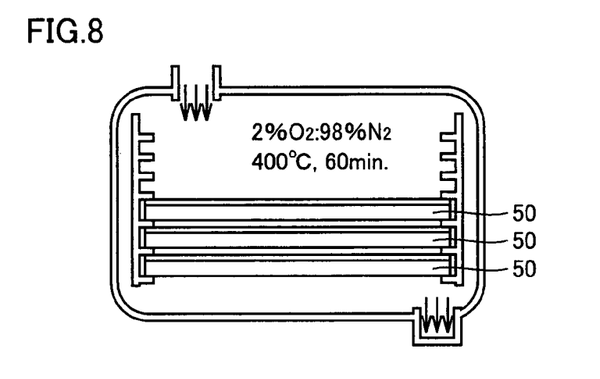
FIG. 8 is a schematic cross-sectional view showing a manner of annealing three types of insulating layers.

Thereafter, as shown in FIG. 8, wafers 50 on which respective three types of insulating layers had been formed were processed for 60 minutes at a temperature of 400° C. in an atmosphere of 2% $O_2$:98% $N_2$. Leakage current values, dielectric constants, change in composition, and FT-IR absorption spectra of the three types of insulating layers processed as above, before and after annealing, were measured. The results are as shown in FIGS. 9 to 15.

Figure 9:
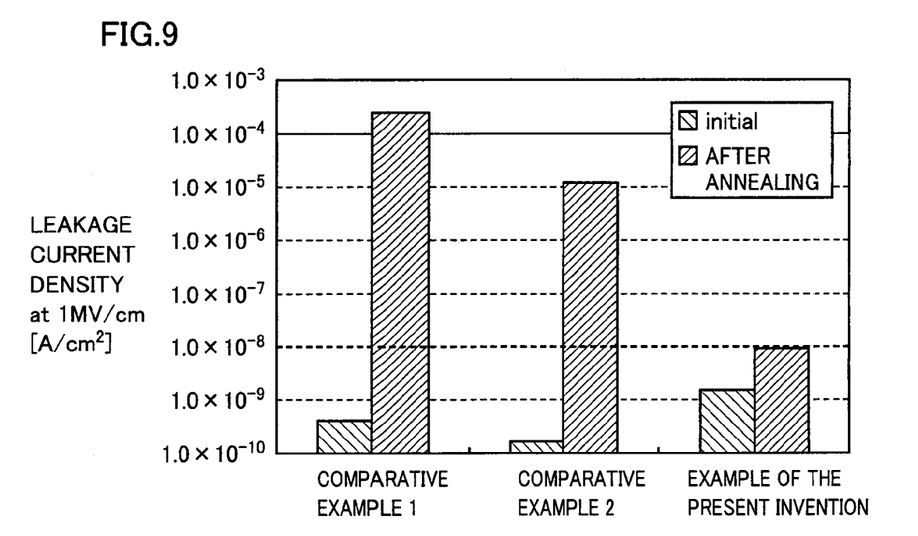
FIG. 9 shows a result of measurement of leakage current values before and after annealing for each of the three types of insulating layers.

Referring to FIG. 9, in the insulating layers according to Comparative Example 1 and Comparative Example 2, the leakage current values after annealing increased to $1.0 \times 10^{-4}$ $A/cm^2$ and $1.0 \times 10^{-5}$ $A/cm^2$, respectively. On the other hand, in the insulating layer according to Example of the Present Invention, even after annealing, the leakage current value was not greater than $1.0 \times 10^{-8}$ $A/cm^2$. Thus, it was found that, in the insulating layer according to Example of the Present Invention, even after annealing, the leakage current value did not increase.

Figure 10:
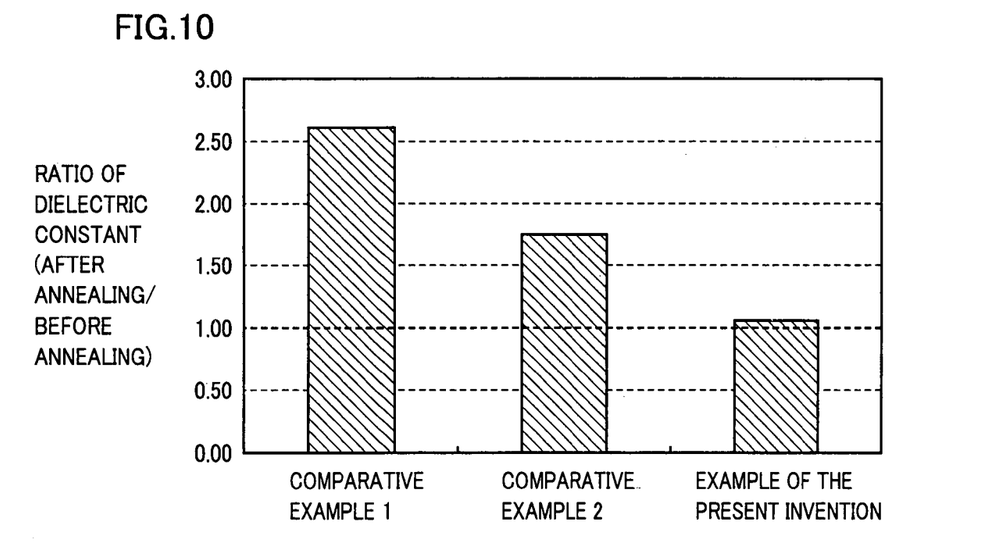
FIG. 10 shows a result of measurement of a ratio between dielectric constant after annealing and dielectric constant before annealing (after annealing/before annealing) for each of the three types of insulating layers.

Referring to FIG. 10, in the insulating layers according to Comparative Example 1 and Comparative Example 2, the ratio of dielectric constant after annealing increased to 2.6 times and 1.8 times as large as that before annealing, respectively. On the other hand, in the insulating layer according to Example of the Present Invention, there was substantially no change in the ratio of dielectric constant between before and after annealing. Thus, it was found that, in the insulating layer according to Example of the Present Invention, even after annealing, the dielectric constant could be maintained low.

Figure 11:
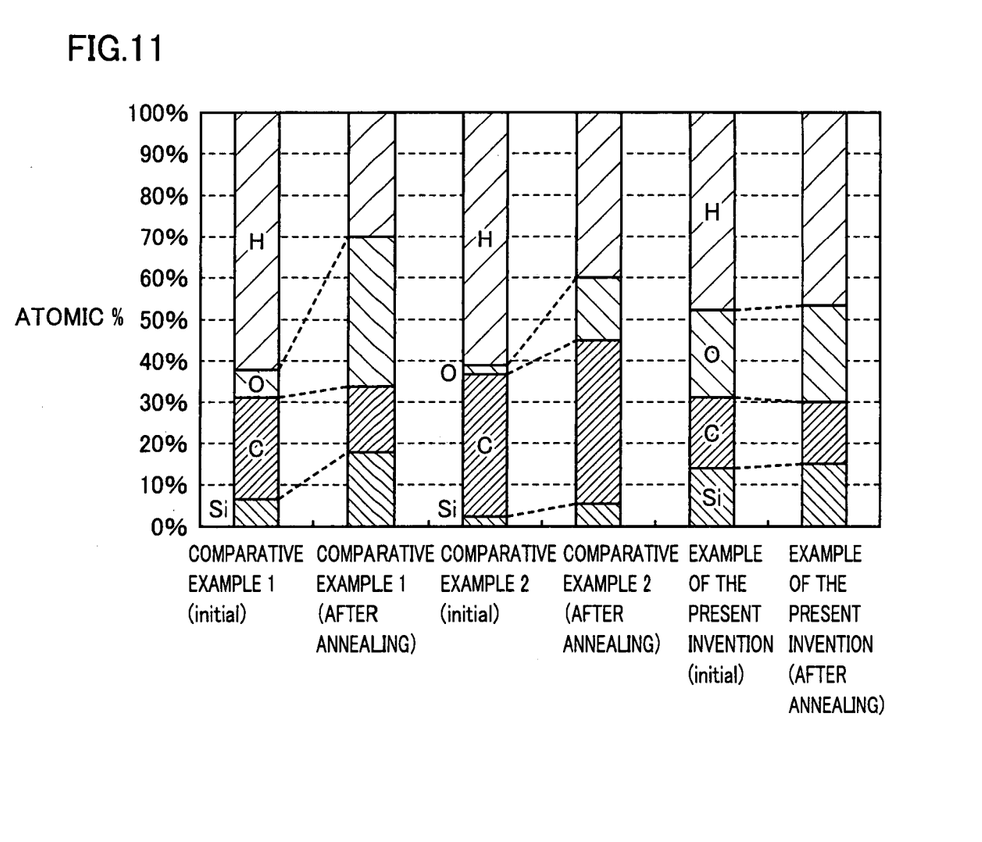
FIG. 11 shows a result of composition analysis before and after annealing for each of the three types of insulating layers.

Referring to FIG. 11, in the insulating layers according to Comparative Example 1 and Comparative Example 2, content of C with respect to content of Si (C/Si ratio) and content of H with respect to content of Si (H/Si ratio) decreased after annealing, as compared with those before annealing. On the other hand, in the insulating layer according to Example of the Present Invention, substantially no change in the composition between before and after annealing was observed. Thus, it was found that, in the insulating layer according to Example of the Present Invention, even after annealing, there is substantially no change in the composition and the composition is stable.

Figure 12:
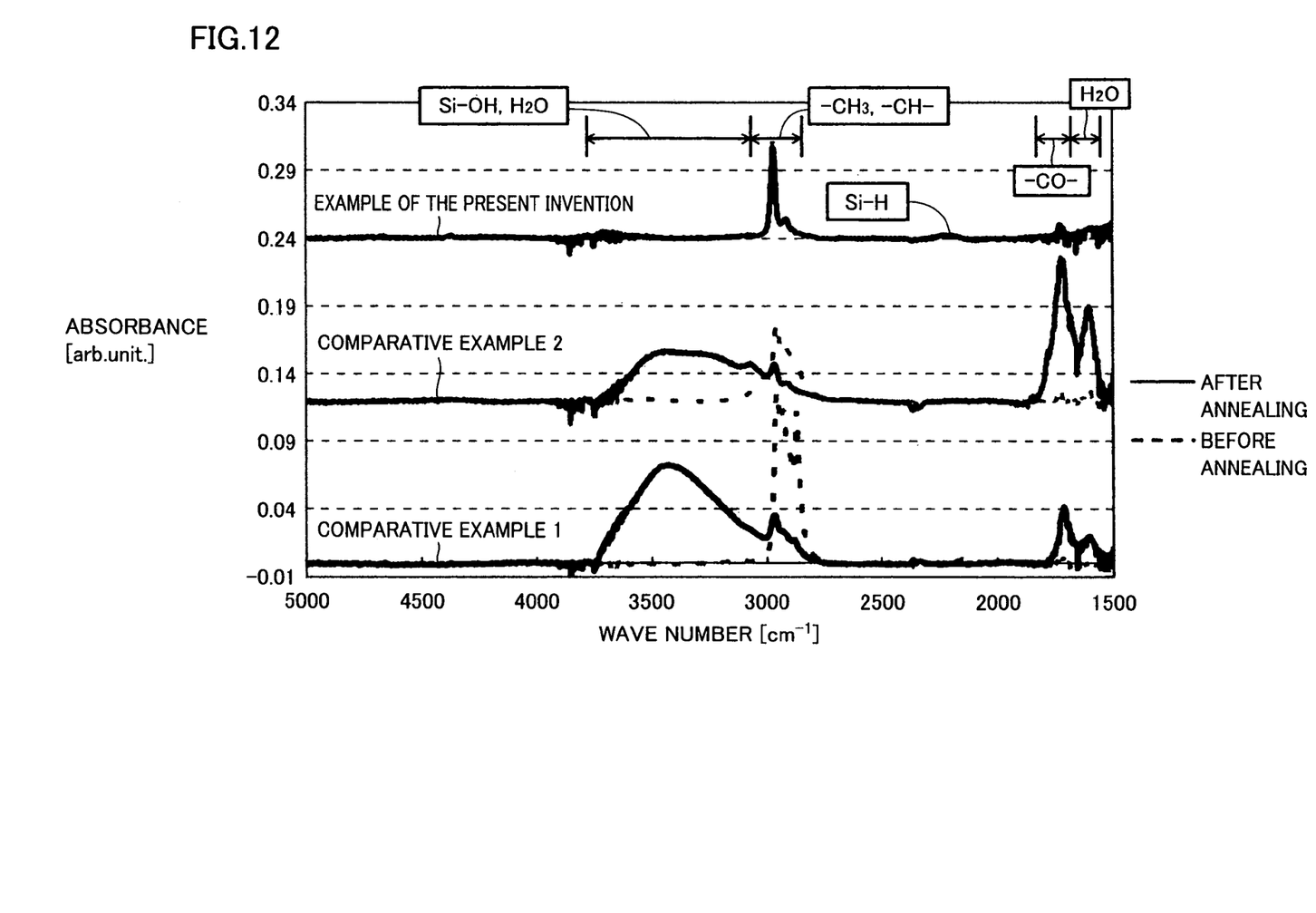
FIG. 12 shows a result of measurement with FT-IR (in a range of wave number from 1500 to 5000 $cm^{-1}$) before and after annealing for each of the three types of insulating layers.

Referring to FIG. 12, in the insulating layers according to Comparative Example 1 and Comparative Example 2, peak intensity of —$CH_3$ and —CH— lowered after annealing, and peak attributed to Si—OH and $H_2O$ newly appeared. On the other hand, in the insulating layer according to Example of the Present Invention, substantially no change in absorption spectrum between before and after annealing was observed.

Figure 13:
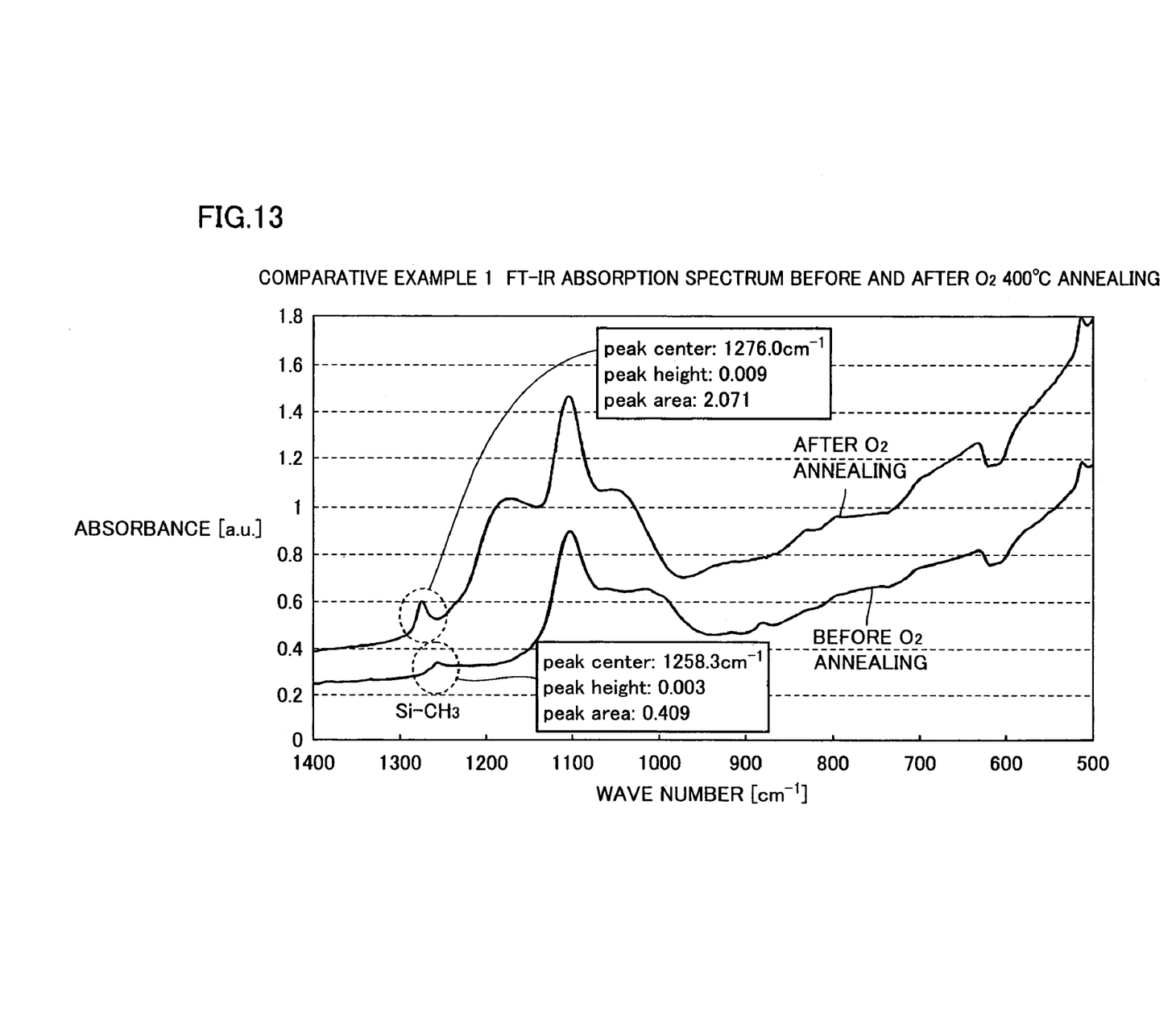
FIG. 13 shows a result of measurement with FT-IR (in a range of wave number from 500 to 1400 $cm^{-1}$) before and after annealing of an insulating layer in Comparative Example 1.

Referring to FIG. 13, absorption line attributed to vibration of Si—$CH_3$ and located at 1258.3 $cm^{-1}$ disappeared after annealing, and new absorption line appeared at 1276 $cm^{-1}$.

Figure 14:
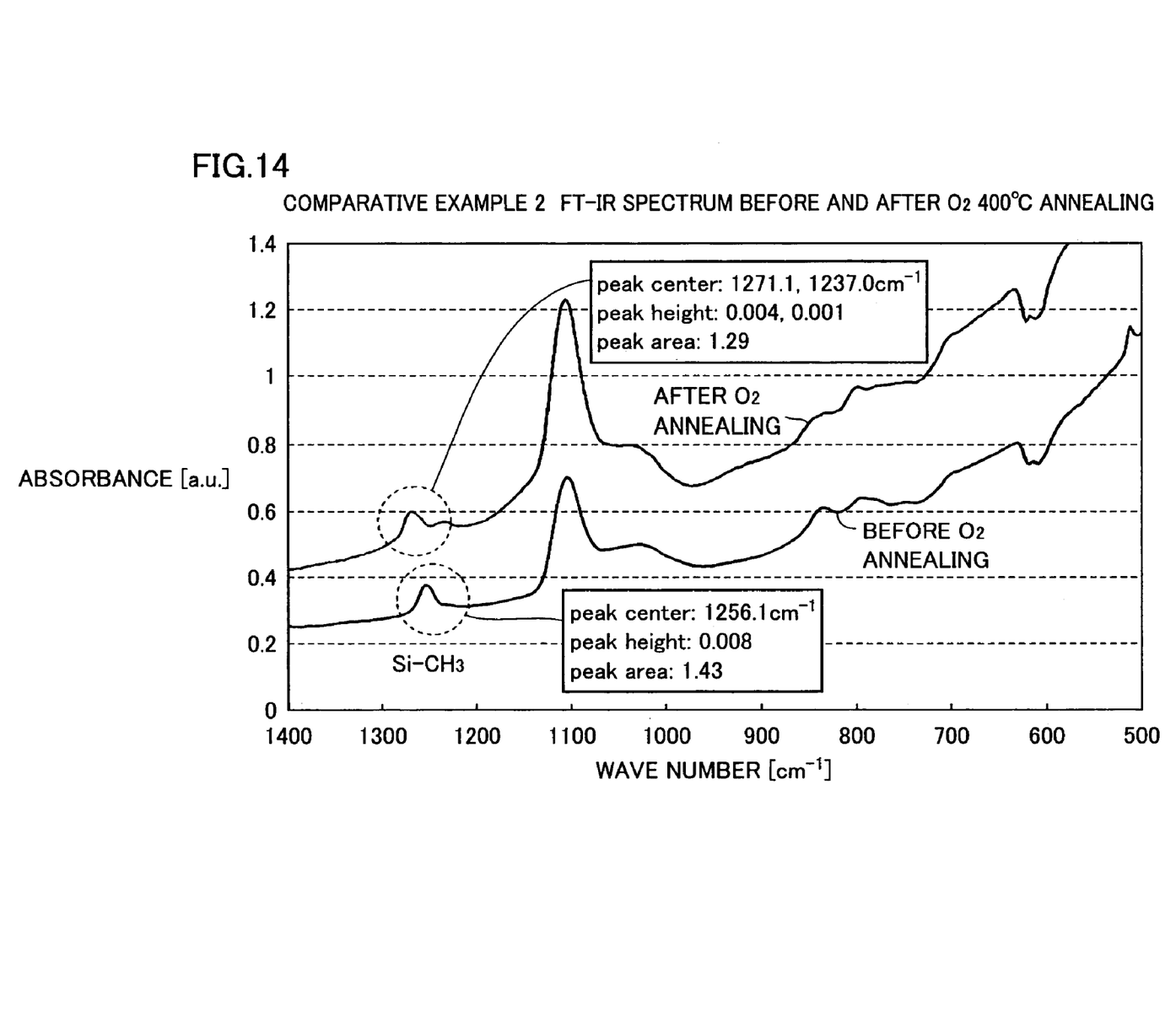
FIG. 14 shows a result of measurement with FT-IR (in a range of wave number from 500 to 1400 $cm^{-1}$) before and after annealing of an insulating layer in Comparative Example 2.

Referring to FIG. 14, absorption line attributed to vibration of Si—$CH_3$ and located at 1256.1 $cm^{-1}$ disappeared after annealing, and new absorption line appeared at 1237.0 $cm^{-1}$ and 1271.1 $cm^{-1}$.

Figure 15:
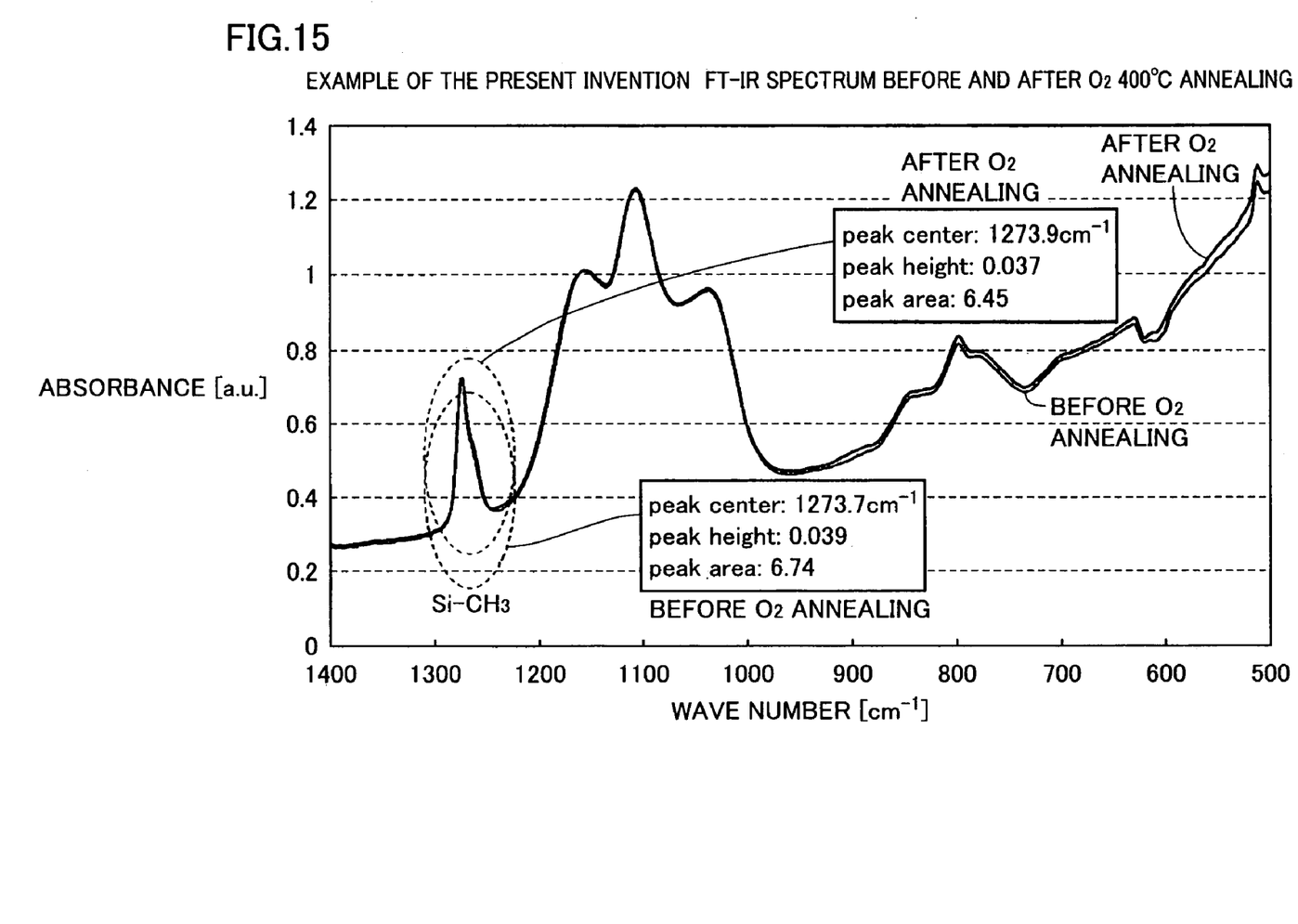
FIG. 15 shows a result of measurement with FT-IR (in a range of wave number from 500 to 1400 $cm^{-1}$) before and after annealing of an insulating layer in Example of the Present Invention.

Referring to FIG. 15, even after annealing, substantially no change in absorbance of the absorption line attributed to vibration of Si—$CH_3$ and located around 1274 $cm^{-1}$ was observed.

A ratio of absorbance before and after annealing above is summarized in Table 1 below.

TABLE 1

| | Ratio of absorbance before and after annealing (after/before (ratio of area)) 1200–3000 cm$^{-1}$ | | | | | | |
|---|---|---|---|---|---|---|---|
| | 1256 [cm$^{-1}$] Si—CH$_3$ (A) | 1258 [cm$^{-1}$] Si—CH$_3$ (B) | 1274 [cm$^{-1}$] Si—CH$_3$ (C) | 2140 [cm$^{-1}$] Si—H | 2199 [cm$^{-1}$] Si—H | 2700–3100 [cm$^{-1}$] —CH$_3$, —CH— | 2800–3800 [cm$^{-1}$] Si—OH, H$_2$O |
| Comparative Example 1 | — | 0% | — | 0% | — | 13.1% | Generated After Annealing |
| Comparative Example 2 | 0% | — | — | — | — | 16.9% | Generated After Annealing |
| Example of the Present Invention | — | — | 95.7% | — | 51% | 96.8% | — |

The insulating layer according to Example of the Present Invention has the absorption line attributed to vibration of Si—CH$_3$ around 1274 cm$^{-1}$ even after annealing, and Si—CH$_3$ around 1274 cm$^{-1}$ has high oxidation resistance, while Si—CH$_3$ around 1256 cm$^{-1}$ and 1258 cm$^{-1}$ has low oxidation resistance. Thus, it was found that the insulating layer according to Example of the Present Invention has high oxidation resistance even after annealing.

As a result of the study above, it was found that, if a material containing carbon, hydrogen, oxygen, and silicon and having absorption peak around 1274 cm$^{-1}$ when measured with FT-IR even after annealing is employed, increase in leakage current after annealing is less likely and high dielectric constant can be maintained.

Although the present invention has been described and illustrated in detail, it is clearly understood that the same is by way of illustration and example only and is not to be taken by way of limitation, the spirit and scope of the present invention being limited only by the terms of the appended claims.

The present invention can particularly advantageously be applied to a semiconductor device having a porous insulating layer and a manufacturing method thereof.

What is claimed is:

1. A semiconductor device, comprising:
    a semiconductor substrate;
    an insulating layer formed on said semiconductor substrate and having a through hole for connection; and
    a porous silica layer having a trench for interconnection communicating to said through hole for connection and formed on said insulating layer in contact with the insulating layer;
    said insulating layer being formed from a material containing carbon, hydrogen, oxygen, and silicon, and having absorption peak in a range from at least 1260cm$^{-1}$ to at most 1280cm$^{-1}$ when measured with Fourier transform infrared absorption spectroscopy, wherein absorption peak of the insulating layer is attributed to Si—CH$_3$ bond.

2. The semiconductor device according to claim 1, wherein said porous silica layer has an average pore diameter in a range from at least 1 nm to at most 10 nm.

3. The semiconductor device according to claim 1, wherein said insulating layer contains said carbon in an amount ranging from at least 10 atomic % to at most 40 atomic %.

* * * * *